United States Patent [19]

Sakamoto

[11] Patent Number: 4,965,520
[45] Date of Patent: Oct. 23, 1990

[54] MAGNETIC RESONANCE IMAGING METHOD

[75] Inventor: Hidenobu Sakamoto, Amagasaki, Japan

[73] Assignee: Mitsubishi Denki Kabushiki Kaisha, Tokyo, Japan

[21] Appl. No.: 284,419

[22] Filed: Dec. 14, 1988

[30] Foreign Application Priority Data

Dec. 15, 1987 [JP] Japan .................. 62-315321
Jan. 8, 1988 [JP] Japan ..................... 63-1272

[51] Int. Cl.$^5$ ........................................... G01R 33/20
[52] U.S. Cl. ..................................... 324/309
[58] Field of Search ............... 324/309, 307, 312, 314, 324/300; 128/653

[56] References Cited

U.S. PATENT DOCUMENTS

| | | | |
|---|---|---|---|
| 4,697,148 | 9/1987 | Strobel et al. | 324/309 |
| 4,792,758 | 12/1988 | Sattin | 324/309 |
| 4,803,431 | 2/1989 | Sano et al. | 324/309 |
| 4,847,560 | 7/1989 | Sattin | 324/309 |

FOREIGN PATENT DOCUMENTS 61-34451 2/1986 Japan .

OTHER PUBLICATIONS

"Simple Proton Spectroscopic Imaging" by W. Thomas Dixon, Ph.D., Mallinckrodt Institute of Radiology, presented at the Sixty-Ninth Scientific Assembly and Annual Meeting of the Radiological Society of North America, Chicago, Ill., Nov. 13–18, 1983, pp. 189–194.

Primary Examiner—Hezron E. Williams
Assistant Examiner—Louis M. Arana
Attorney, Agent, or Firm—Birch, Stewart, Kolasch & Birch

[57] ABSTRACT

In an NMR imaging method, the phase encode amount applied to the respective echo signals in the same sequence of operation are made to have different values and the phase encoding magnetic fields Gen are made to disorder the phases of the NMR signals so as not to generate stimulated echo signals. In another aspect, the time periods of application of the signal reading magnetic field Gp applied between the 90° RF pulse and the 180° RF pulse are made to have different values equal in number to the chemical shifts. By varying the time period of application of the signal reading magnetic field, spin echo signals having different phase variance amounts due to the different chemical shifts are generated before or after the time point at which the spin echo due to the RF pulse is expected to occur. Accordingly, control difficulties for synchronizing the RF pulse and the slicing magnetic field and shifting them by the same time length is avoided wherein two chemical shifts can be separated.

9 Claims, 5 Drawing Sheets

MAGNETIC RESONANCE IMAGING METHOD

BACKGROUND OF THE INVENTION

The present invention relates to a method of magnetic resonance imaging for imaging the internal structure of substances utilizing nuclear magnetic resonance (NMR) or electron spin resonance (ESR). In one aspect of the invention, it relates more particularly to slice imaging which produces a plurality of images by means of multiple echoes. In another aspect of the invention, it relates more particularly to slice imaging which utilizes chemical shifts which differ depending on the chemical status of the particular substance.

FIG. 1 shows an example of a conventional NMR imaging apparatus. This apparatus comprises a static magnetic field generator 51 for applying a static magnetic field to a sample 50 to be examined, such as a human body, an RF (radio frequency) coil 55 for supplying an RF energy to the sample 50 and receiving an NMR signal from the sample 50, and gradient magnetic field coils 60, 62 and 64 for applying gradient magnetic fields to the sample 50.

The RF coil 55 irradiates RF pulses which are generated at a transmitter 58, and transmitted via the transmit/receive switch 57 and a matching unit 56. NMR signals from the sample 50 are received by the RF coil 55, and transmitted via the matching unit 56 and the transmit/receive switch 57 to a receiver 59.

The gradient magnetic field coils 60, 62 and 64 are respectively connected to the gradient magnetic field power supplies 61, 63 and 65 for generating gradient magnetic fields in the X-axis, Y-axis and Z-axis directions respectively. Here, the magnetic field generated by the Z-axis gradient magnetic field coil 64 is the slicing magnetic field Gs for designating the slice plane. The magnetic field generated by the X-axis gradient magnetic-field coil 60 is the signal reading magnetic field Gp for collecting signals. The magnetic field generated by the Y-axis gradient magnetic field coil 62 is the phase encoding magnetic field Gen.

A computer 52 generates control data for the imaging apparatus, and generates images in accordance with the NMR signals from the receiver 59 by means of two-dimensional Fourier conversion. The computer 52 is associated with a console unit 53 for manual input of commands and data and a display unit 54 for displaying the generated images and other data.

A sequence controller 67 controls various operations of the entire apparatus, such as irradiation of the RF pulses, reception of the NMR signals, generation of the gradient magnetic fields Gs, Gp and Gen, and operation of a diagnosis table driving unit 66.

FIG. 2 is a timing chart for explaining a prior art multi-echo imaging method.

In this imaging method, a slicing magnetic field Gs (B1) is applied to designate the slice plane at the same time as the irradiation of a 90° RF pulse (A1) for generating an NMR signal. After that, a slicing magnetic field Gs (B2) of the opposite polarity is applied to rectify the disorder of the phase of the nuclear spins. The areas B1 and B2 shown by hatching in FIG. 2 are set to be equal to each other.

Subsequently, a reading magnetic field Gp (D1) and a phase encoding magnetic field Gen (C1) are applied. The reading magnetic field Gp (D1) is applied for causing disorder in the phase of the NMR signals in the direction of reading.

Subsequently, a 180° RF pulse (A2) and another slicing magnetic field Gs (B3) are applied $\tau_1$ after the peak of the 90° RF pulse. This will produce a spin echo signal (E1) $\tau_1$ after the peak of the 180° RF pulse (A2). The reading magnetic field Gp is applied in such a way that the area of D2 equals the area of D1.

In order to read the spin echo signal (E1), another reading magnetic field Gp (D3) is applied immediately following the reading magnetic field (D2) without interruption.

In order to produce a second spin echo signal (E2), another 180° RF pulse (A3) having a peak $\tau_2$ after the generation of the spin echo signal and another slicing magnetic field Gs (B4) are applied. The reading magnetic field Gp (D4) is applied in such a way that the area of D4 and the area of D3 are equal to each other. Another reading magnetic field Gp (D5) is applied without interruption. A second spin echo signal (E2) is then obtained.

In order to obtain a third spin echo signal (E3), in the same manner as described above in connection with the generation of the spin echo (E2), a reading magnetic field Gp (D6) is applied in such a way that the area of D6 equals the area of D5. Similarly, another reading magnetic field Gp (D8) is applied in such a way that the area of D8 equals the area of D7.

The above-described sequence of operations yields a series of signals for one direction of reading. In order to obtain an image of a predetermined matrix size, the phase encode amount is varied, i.e., the amplitude of the phase encoding magnetic field Gen (C1) is varied by a predetermined amount between succesive sequences of operations, and series of echo signals (E1), (E2), (E3) and (E4) are collected a number of times corresponding to the matrix size. The computer 52 reconstructs a multi-echo image from the echo signals (E1), (E2), (E3) and (E4) thus obtained.

A problem associated with the method of FIG. 2 is that it is possible that an NMR signal generated because of the imperfection of the 180° RF pulse, is generated overlapping the spin echo signal that is to be detected. Particularly, where $\tau_1 = \tau_2 = \tau_3 = \tau_4$, after the third spin echo signal, a stimulated echo signal due to the imperfection of the 180° RF pulse is generated at the same position as the spin echo signal so a false image called "artifact" is generated in the image of the third spin echo signal and the subsequent images. This seriously degrades the quality of the image.

FIG. 3 is a timing chart for explaining another conventional chemical shift NMR imaging method that is shown in Denshi Tsushin Gakkai Gijutsu Hokoku (Technical Reports of the Institute of Electronics and Communication Engineers of Japan) MBE 85-9.

Generally speaking, if none of the X-axis, Y-axis and Z-axis gradient magnetic fields are applied, when a 90° RF pulse is irradiated and a 180° RF pulse is irradiated a predetermined time after the irradiation of the 90° RF pulse, then an echo signal is generated upon expiration of the same time as the above-mentioned predetermined time after the irradiation of the 180° RF pulse. This echo signal is called an echo signal due to an RF pulse.

If a signal reading magnetic field Gp is applied for a predetermined time period between the irradiation of a 90° RF pulse, and the irradiation of a 180° RF pulse, and another signal reading magnetic field Gp of the same intensity is applied after the irradiation of the 180° RF pulse, then a spin echo signal is generated upon expiration of the above-mentioned predetermined time after the commencement of the application of the later signal reading magnetic field Gp. This spin echo signal is called a spin echo signal due to a gradient magnetic field.

Where there are two chemical shifts, there are two different resonant frequencies. This means that the phase of the spin varies at a rate corresponding to the difference between the resonant frequencies. The phases of the spins are in alignment when an echo due to the RF pulse is generated, but in the case of spin echoes due to a gradient magnetic field only such phases that are due to the application of the gradient magnetic field can be aligned and other phases remain out of order.

If this characteristic is utilized for staggering the time point of generation of the spin echo due to the RF pulse and the time point of generation of the spin echo due to the gradient magnetic field, then it is possible to vary the phases of the signals having different chemical shifts, and a phase different proportional to the time difference can be generated.

The above expression "two chemical shifts" means presence of two chemical shifts in the spins which are the object of the imaging of the slice. For instance, when an NMR imaging method directed to protons is used for imaging a human body, two types of protons, i.e., protons mainly of water and protons of fat are imaged. Protons of water and protons of fat have slightly different sensitivity to a static magnetic field. Even when protons of water and protons of fat are placed in the same static magnetic field, the static magnetic field they actually sense differs slightly. The difference in the sensitivity is in the order of 3.5 ppm. In a magnetic field of 1.5 T, the difference in frequency is given by:

$$1.5(T) \times 3.5(\text{ppm}) \times 10^{-6} \times 42.6 \times 10^6 \, (\text{Hz}/T) = 220 \, (\text{Hz})$$

This value of difference depends on the physical property of the spins which are the object of the imaging. Because of this property, the number of chemical shifts is determined.

Where there are two or more chemical shifts, the phases of the spin echo due to the RF pulse and the spin echo due to the gradient magnetic field can be varied, and the variation in the phases are proportional to the respective chemical shift amounts. Accordingly, in order to separate all the chemical shifts, the time period that is taken until the spin echo due to the gradient magnetic field is generated must have a different value for each of the chemical shifts.

The conventional method of separation will now be described with reference to FIG. 3.

First, a 90° RF pulse $F_{11}$ is irradiated, and by application of a waveform $K_{11}$ of the slicing magnetic field Gs, the slice position is selected, and the disorder of the phases of the nuclear spins are rectified by a waveform $K_{21}$ of the polarity opposite to that of the waveform $K_{11}$. Upon expiration of $\tau_{11}$ after the irradiation of the 90° RF pulse, a 180° RF pulse $F_{21}$ is irradiated to generate in combination with a slicing magnetic field Gs ($K_{31}$), a spin echo $J_{11}$.

In an ordinary imaging, the timing of output of the waveform $I_2$ is so adjusted that the time period of application of the waveform $I_2$ until the peak of the spin echo $J_{11}$ is equal to t, which is the time period of application of the waveform $I_1$ of the reading magnetic field Gp so that the peak of the spin echo takes place upon expiration of $\tau_{21}$ ($\tau_{21} = \tau_{11}$) from the 180° RF pulse $F_{21}$. The intensities of the magnetic fields of the waveforms $I_1$ and $I_2$ are equal. In this condition, the phase variance due to the chemical shift and the reading magnetic field Gp are canceled at the time point of occurrence of the peak of the spin echo signal $J_{11}$. Where there are two or more chemical shifts, all the signals are obtained with the same phase at the same time.

To separate the chemical shifts, the time period $\tau_{12}$ up to the irradiation of the 180° RF pulse $F_{22}$ is varied so that the phase variance due to the chemical shift and the phase variance due to the signal reading magnetic field Gp are staggered. In this case, it is necessary that the slicing magnetic field Gs be shifted to coincide with the irradiation of the 180° RF pulse. For this reason, even if the time period $\tau_{12}$ up to the 180° RF pulse $F_{22}$ is changed the time point at which the peak of the spin echo signal $J_{12}$ occurs is fixed at $t_1$ after the commencement of the application of the second signal reading magnetic field Gp. Accordingly, the phase variances due to the signal reading magnetic fields Gp is canceled. However, the phase variance amount (proportional to $\tau_{12}$) between the 90° RF pulse and the 180° RF pulse due to the difference in the chemical shift and the phase variance amount (proportional to $\tau_{22}$) after the 180° RF pulse are not canceled because $\tau_{12} \neq \tau_{22}$. For instance, assume that there are two chemical shifts and the difference in frequency between the chemical shifts is $\Delta f$. During the time period until the occurrence of the peak of the spin echo signal $J_{12}$, the phase variance amount $2\pi \cdot (\Delta f) \cdot \tau_{12}$ due to the time period $\tau_{12}$ and the phase ariance amount $2\pi \cdot (\Delta f) \cdot \tau_{22}$ due to the time period $\tau_{22}$ differ from each other by:

ti $2\pi \cdot (\Delta f) \cdot \tau_{12} - 2\pi \cdot (\Delta f) \cdot \tau_{22} = 2\pi \cdot (\Delta f) \cdot (\tau_{12} - \tau_{22})$ By adjusting the timing of irradiation of the 180° RF pulse $F_{22}$ so that $2\pi \cdot (\Delta f) \cdot (\tau_{12} - \tau_{22}) = \pm \pi$, signals of all the chemical shifts (in the case under consideration, two chemical shifts) can be extracted with different phases.

The phase of the chemical shifts of the spin echo signals $J_{11}$ and $J_{12}$ are opposite to each other so the signs of the signals are opposite. Accordingly, if the sums of the spin echo signals $J_{11}$ and $J_{12}$ are determined, there would not be signals of chemical shift of which the phase variance amount has been canceled. If the differences are determined, only such signals of the chemical shifts of which the phase variance amount has not been canceled are obtained. When the signals of the sums and the differences that have thus been obtained are utilized, various images of the respective chemical shifts are obtained independently.

However, in the method of the chemical shift imaging of FIG. 3, it is necssary to synchronize the 180° RF pulse $F_{21}$ for signal collection and the waveform of the slicing magnetic field Gs (K32) and shift them by the same time length, resulting in control difficulties.

SUMMARY OF THE INVENTION

An object of the present invention is to solve the problems described above with reference to FIG. 2 and FIG. 3.

Another object of the invention is to improve the quality of the image with simple control.

Another object of the invention is to remove the artifact due to the imperfection of the 180° RF pulses.

Another object of the invention is to enable separation of the chemical syhifts with simple control.

According to an NMR imaging method of the invention, the phase encode amount applied to the respective echo signals in the same sequence of operation are made to have different values and it is ensured that the phase encoding magnetic fields Gen do not disorder the phases of the NMR signals and generate stimulated echo signals.

According to another aspect of the invention, the time periods of application of the signal reading magnetic field Gp applied between the 90° RF pulse and the 180° RF pulse are made to have different values, the number of which is equal of the number of the chemical shifts. By varying the time period of application of the signal reading magnetic field, before or after the time point at which the spin echo due to the RF pulse is expected to occur, spin echo signals having different phase variance amounts due to the different chemical shift amounts are generated. Accordingly, the difficult control required for synchronizing the RF pulse and the slicing magnetic field and shifting them by the same time length is no longer required, and two or more chemical shifts can be separated with simple control.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE EMBODIMENTS

An embodiment of the NMR imaging method according to the invention will now be described with reference to FIG. 4. Reference marks identical to those in FIG. 2 denote identical or corresponding waveforms, time periods and time points.

Figure 1:
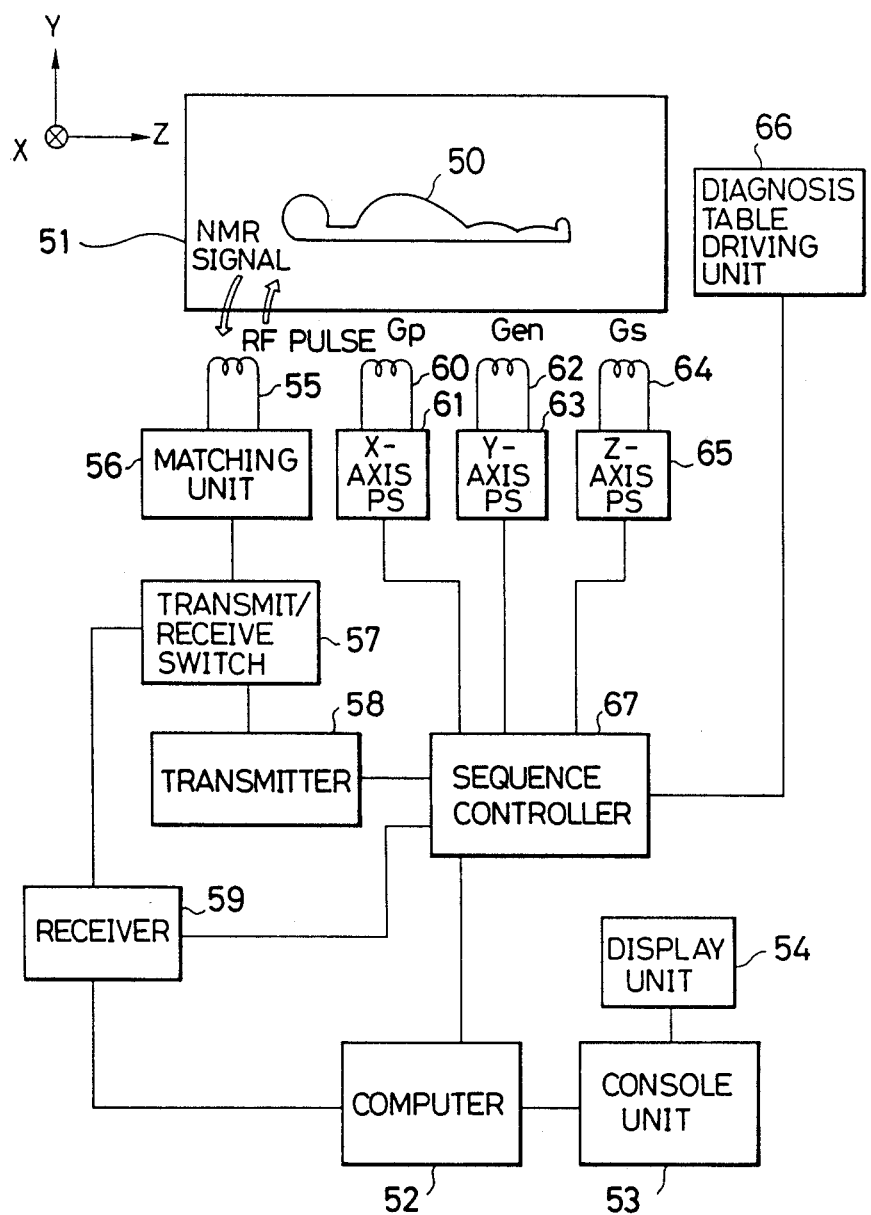
FIG. 1 is a block diagram showning a conventional NMR imaging apparatus.
Figure 2:
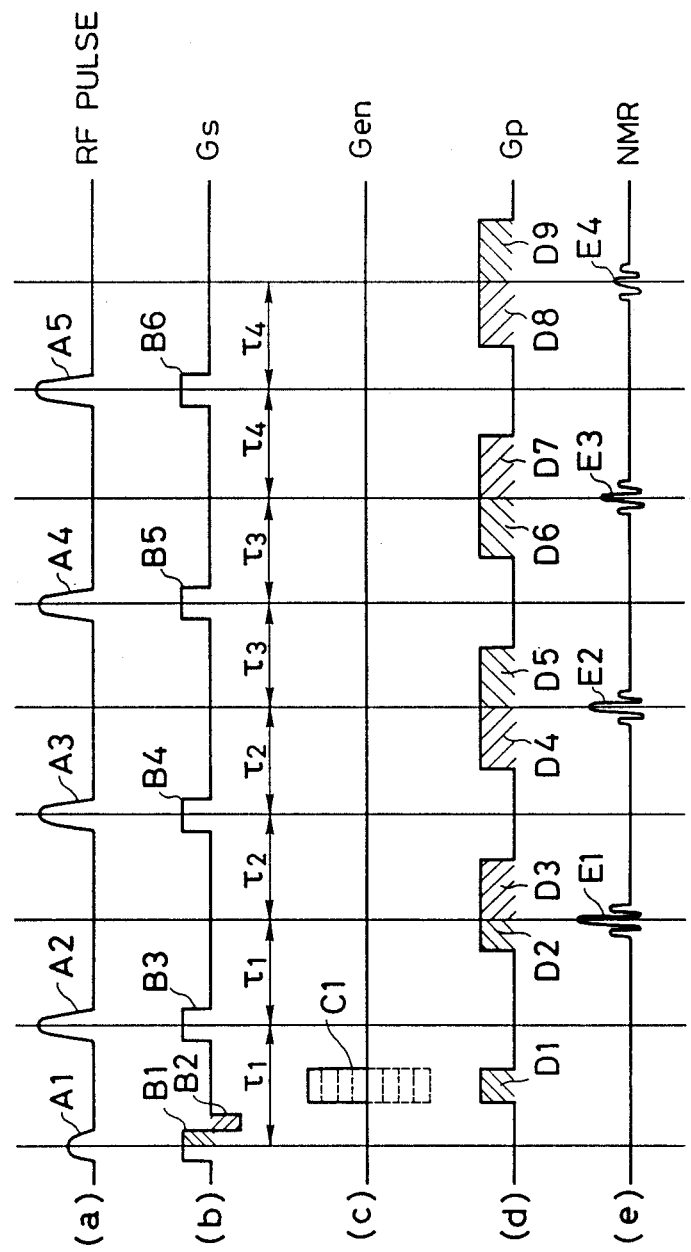
FIG. 2 is a timing chart for explaining conventional NMR imaging.

The imaging method of the present embodiment is identical to the conventional method of FIG. 2 in that the slicing magnetic field Gs (B1) is applied to designate the slice plane at the same time as the irradiation of the 90° RF pulse for generating the NMR signal. The slicing magnetic field Gs (B2) of the opposite polarity is thereafter applied to rectify the disorder in the phases of the nuclear spins, and the reading magnetic field Gp (D1) is thereafter applied.

Then, a 180° RF pulse (A2) and the slicing magnetic field Gs (B3) are applied, and a phase encoding magnetic field Gen (C1) is thereafter applied, and then the reading magnetic field Gp (D2, D3) are applied to generate a first spin echo signal (E1), and another phase encoding magnetic field Gen (C2) having a polarity opposite to that of the phase encoding magnetic field Gen (C1) and having the same pulse area (the same intensity and the same time period of application, in the case under consideration) as the phase encoding magnetic field Gen (C1) is applied.

Then, the same control as was done for the generation of the first spin echo signal (E1) is performed to generate a second spin echo signal (E2). That is, the 180° RF pulse (A3) and the slicing magnetic field Gs (B4) are applied and then another phase encoding magnetic field Gen (C3) is applied. Another reading magnetic field Gp (D4, D5) is then applied to generate a second spin echo signal (E2), and another phase encoding magnetic field Gen (C4) having a polarity opposite to that of the phase encoding magnetic field Gen (C3) and the same pulse area as the phase encoding magnetic field Gen (C3) is then applied.

Then, to generate a third spin echo signal (E3), a similar control is performed. That is, another 180° RF pulse (A4) and another slicing magnetic field Gs (B5) are applied and then a phase encoding magnetic field Gen (C5) is applied. Another reading magnetic field Gp (D6, D7) is then applied to generate a third spin echo signal (E3). Another phase encoding magnetic field Gen (C6) having a polarity opposite to that of the phase encoding magnetic field Gen (C5) and having the same pulse area as the phase encoding magnetic field Gen (C5) is then applied.

Then, to generate a fourth spin echo signal (E4), a similar control is performed. That is, another 180° RF pulse (A5) and another slicing magnetic field Gs (B6) are applied and then a phase encoding magnetic field Gen (C7) is applied. Another reading magnetic field Gp (D8, D9) is then applied to generate a third spin echo signal (E4). Another phase encoding magnetic field Gen (C8) having a plurality opposite to that of the phase encoding magnetic field Gen (C7) and having the same pulse area as the phase encoding magnetic field Gen (C7) is then applied.

The detection of the spin echo signals according to the above-described method are applied to a predetermined matrix size, while varying the intensity of the phase encoding magnetic field Gen. The detected NMR signals are rearranged in the order of the phase encode amount to reconstruct the image of the slice.

Figure 4:
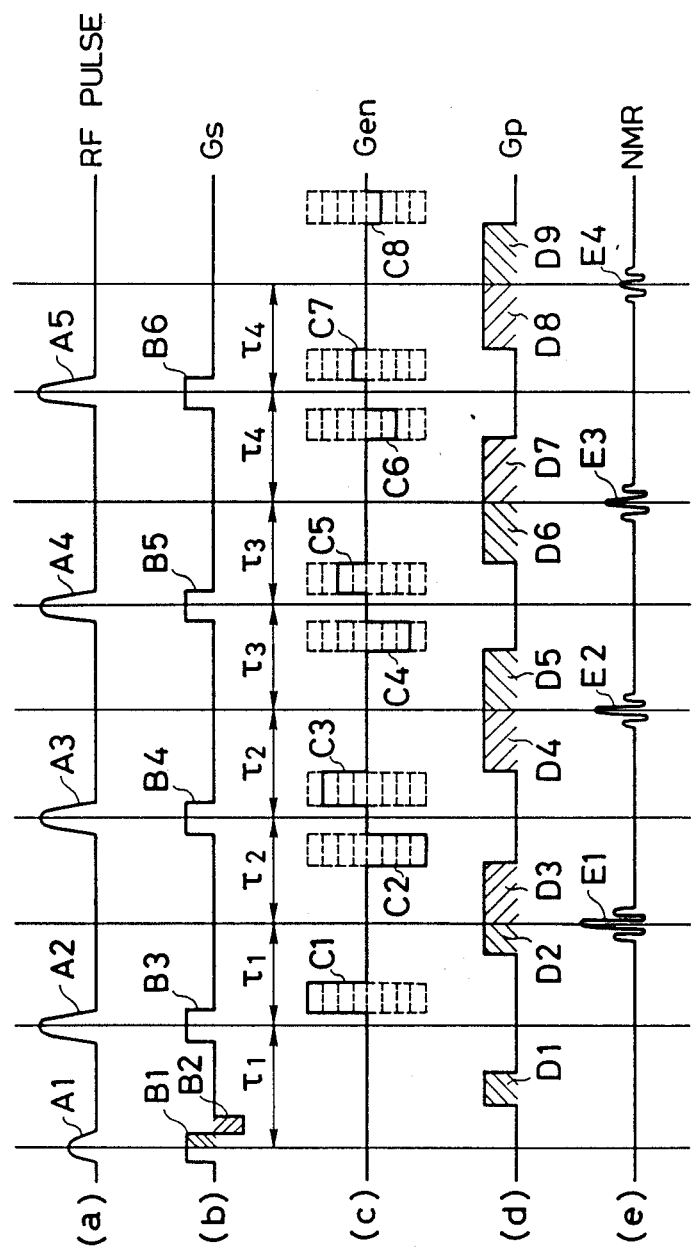
FIG. 4 is a timing chart for explaining an embodiment of an NMR imaging method according to the invention.

In FIG. 4, the phase encode amount is decreased constantly for each spin echo signal, but there is no restriction on the manner of variation of the phase encode amount. The only requirement is that all the phase encode amounts are covered when the reading is repeated, the number of samples corresponding to the predetermined matrix size.

The phase encode amount can be varied in a variety of manners. But it is preferable that the phase encoding magnetic field Gen is reduced constantly as indicated by (C1), (C3), (C5) and (C7) in FIG. 4 since the processing will be easier if there is some rules in the variation.

In the embodiment described, the number of spin echoes to be detected is four. But the invention is applicable where the number of the spin echoes is other than four.

As has been described, the phase encoding magnetic field C1, C3, C5 and C7 are applied to detect the respective spin echo signals, and thereafter the phase encoding magnetic fields C2, C4, C6 and C8 having the opposite polarity and the same pulse area are applied so as to erase the effect of the phase encoding magnetic field, in preparation for the application of the next phase encoding magnetic field. Accordingly, the effect of the preceding phase encoding magnetic field is completely removed, and at any step of imaging, generation of stimulated echo signals due to the imperfection of the 180° RF pulse can be suppressed and images of a high quality without artifact can be obtained.

Figure 3:
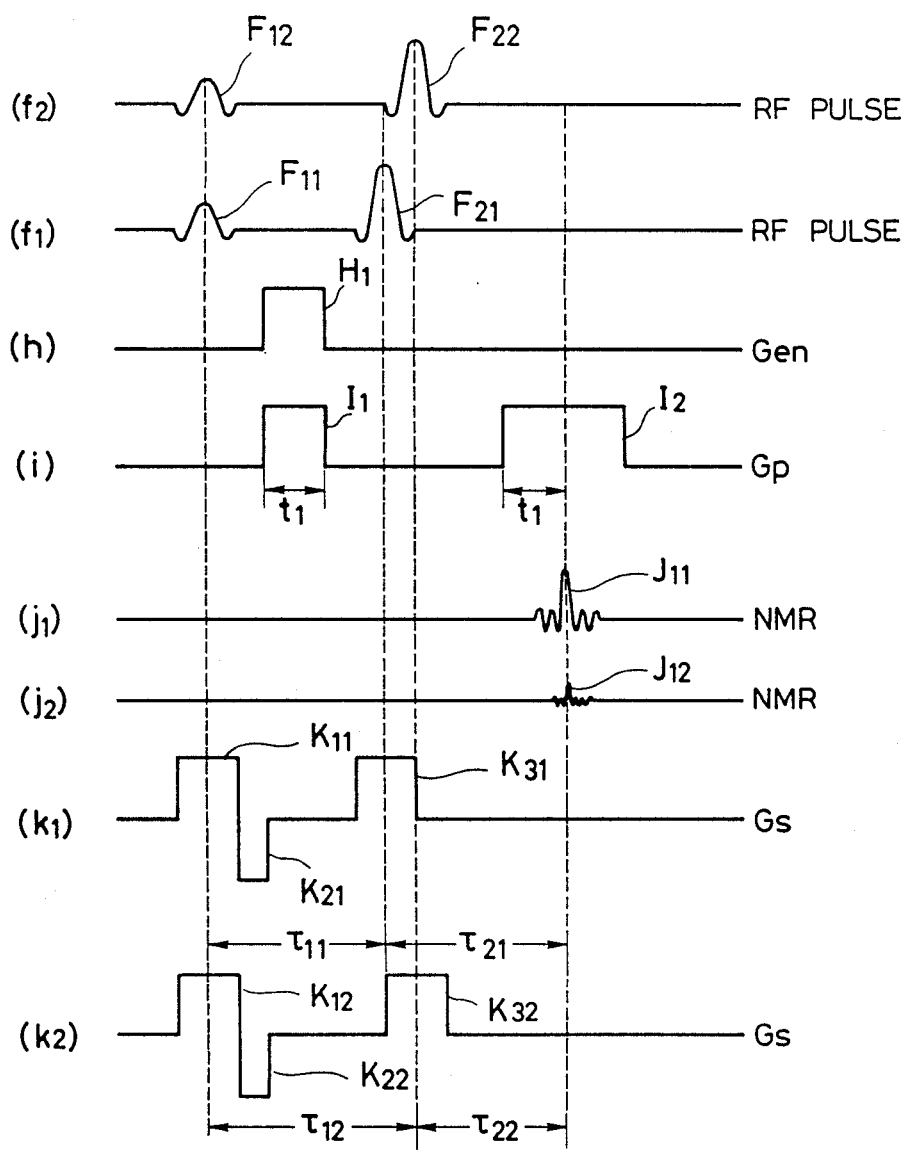
FIG. 3 is a timing chart for explaining another conventional NMR imaging method.
Figure 5:
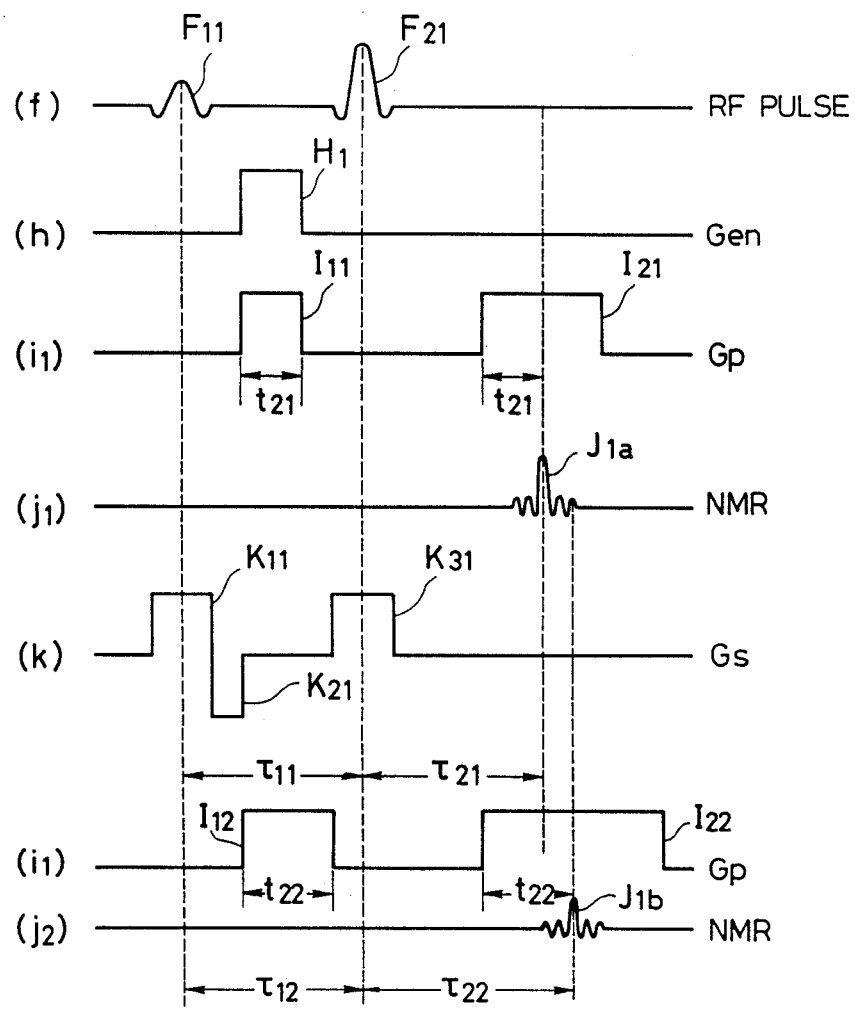
FIG. 5 is a timing chart for explaining another embodiment of an NMR imaging method according to the invention.

FIG. 5 is a timing chart for explaining a chemical shift imaging method according to another embodiment of the invention. Reference marks identical to those in FIG. 3 denote identical or corresponding signal waveforms, time periods and time points.

Generally, to obtain slice image of a substance having two chemical shifts, two slice images must be extracted.

In FIG. 5, $J_{1a}$ and $J_{1b}$ are spin echo signals that are generated when the signal reading magnetic fields Gp are applied for the time periods $t_{21}$ and $t_{22}$, respectively.

First, the method of generating spin echo signals due to RF pulses will be described. The method of performing the ordinary imaging to collect the signals of all the chemical shifts with the same phase is identical to the conventional method shown in FIG. 3.

To separate the chemical shifts, the time period $\tau_{12}$ from the irradiation of the 90° RF pulse until the irradiation of the 180° RF pulse is made equal to $\tau_{11}$, the time period of application of the signal reading magnetic field Gp between the 90° RF pulse $F_{11}$ and the 180° RF pulse $F_{21}$ is varied (increased or decreased) to be $t_{21}$ and $t_{22}$, respectively, so that the time point at which the phase variance of the signal reading magnetic field Gp is canceled, is advanced or retarded as compared with the conventional method so as to be staggered with respect to the time point at which the phase variance due to the chemical shift due to the RF pulse is canceled.

Since the time periods of application of the waveforms $I_{11}$ and $I_{12}$ of the signal reading magnetic field Gp are varied to be $t_{21}$ and $t_{22}$, respectively, and the time points of commencement of the application of the waveforms $I_{21}$ and $I_{22}$ of the signal reading magnetic field Gp coincide, the phase variance due to the signal reading magnetic field Gp is canceled upon expiration of the time period $t_{21}$ or $t_{22}$ of application of the waveforms $I_{11}$ or $I_{12}$, after the application of the waveforms $I_{21}$ or $I_{22}$, that is $\tau_{21}$ or $\tau_{22}$ after the irradiation of the 180° RF pulse.

However, upon expiration of the time period $\tau_{21}$ or $\tau_{22}$, the phase variance amount due to the difference in the chemical shift is proportional to the time period $\tau_{11}$, $\tau_{21}$ or $\tau_{12}$, $\tau_{22}$, so, assuming there are two chemical shifts, the phase difference is $2\pi \cdot \Delta f \cdot (\tau_{11} - \tau_{21})$ or $2\pi \cdot \Delta f \cdot (\tau_{12} - \tau_{22})$ where $\Delta f$ is the difference in frequency.

If the same time period $t_{22}$ of application of the signal reading magnetic field Gp is adjusted so that the above phase difference $2\pi \cdot \Delta f \cdot (\tau_{11} - \tau_{21})$ or $2\pi \cdot \Delta f \cdot (\tau_{12} - \tau_{22})$ is $\pm \pi$, the phase of the chemical shift is reversed to that of the ordinary imaging, so the sign of the signal is reversed. The sum of or the difference between spin echo signal $J_{1a}$ obtained with the application time period $t_{21}$ and the spin echo signal $J_{1b}$ obtained with the application time period $t_{22}$ in the ordinary imaging is determined so the spin echo signals $J_{1a}$ and $J_{1b}$ of the two chemical shifts can be separated. Accordingly, using the signals $J_{1a}+J_{1b}$, $J_{1a}-J_{1b}$, chemical shift images are independently obtained.

In the above embodiment, it is assumed that the there are two chemical shifts. But the invention can be applied even where there are three or more chemical shifts. In this case, the time period of application of the signal reading magnetic field Gp is varied to have different values, the number of which is equal to the number of chemical shifts, so that the chemical shift amounts are varied by the predetermined phases. The collected spin echo signals can be subjected to Fourier conversion with respect to the phase amount for separating the chemical shifts.

If the time period of application of the signal reading magnetic field Gp is made longer than in the ordinary case, the time period $\tau_{22}$ becomes longer, the echo peak is retarded. If the time period of application is made shorter, the time period $\tau_{22}$ becomes shorter. Either phase variance can be selected.

By varying the phase, the timing for extracting the data for the signal collection is varied a little. As a measure against this, the timing for extracting the data can be shifted by the time period corresponding to the variation in the time period of application of the signal reading magnetic field Gp.

As has been described, the time period of application of the signal reading magnetic field applied between the 90° RF pulse and the 180° RF pulse is varied to generate spin echo signals having different phase variance amounts due to the difference in the chemical shift amounts before or after and after the time point when the spin echo due to the RF pulse is expected to occur. It is therefore not necessary to synchronize the RF pulse and the slicing magnetic field and shaft them by the same time length, and the spin echo signals can be separated with a simple control.

The embodiments of FIG. 4 and FIG. 5 have been described as applied to NMR imaging. But the invention is also applicable to the ESR imaging.

What is claimed is:

1. A method of magnetic resonance imaging comprising the steps of:
   (a) generating a static magnetic field through a sample to be examined;
   (b) applying a first RF magnetic field pulse at a first slice select gradient pulse for designating a slice plane of the sample;
   (c) applying a first signal reading gradient pulse;
   (d) applying a second RF magnetic field pulse and a second slice select gradient pulse;
   (e) applying a first phase encoding gradient pulse having a predetermined pulse area;
   (f) applying a second signal reading gradient pulse to generate a magnetic resonance signal from the sample;
   (g) applying a second phase encoding gradient pulse having a polarity opposite to said first phase encoding gradient pulse; and
   (h) repeating said steps (d) through (g) a plurality of times to construct a slice image on the basis of a plurality of said magnetic resonance signals from said repeated steps (d) through (g), an intensity of said first phase encoding gradient pulse varied to have a different value for each of said repeated steps (d) through (g).

2. A method of magnetic resonance imaging according to claim 1, wherein siad first phase encoding gradient pulse and said second phase encoding gradient pulse have equal pulse area and are rectangular pulses having equal magnetic field intensity and time duration.

3. A method of magnetic resonance imaging according to claim 1, wherein said first slice select gradient pulse comprises a first slicing magnetic field pulse for causing phase disorder in nuclear spins and a second slicing magnetic field pulse having an opposite polarity to that of aid first slicing magnetic field pulse and having the same energy for rectuifying disorder of phases of said nuclear spins.

4. A method of magnetic resonance imaging according to claim 1, wherein said steps (d) through (g) are repeated twice or more.

5. A method of magnetic resonance imaging comprising the steps of:
   (a) generating a static magnetic field through a sample to be examined;
   (b) applying a first RF magnetic field pulse and a slice select gradient pulse for designating a slice plane of the sample;
   (c) applying a first signal reading gradient pulse and a phase encoding gradient pulse;
   (d) applying a second RF magnetic field pulse;
   (e) applying a second signal reading gradient pulse to generate a magnetic resonance signal within a time period of application of said second signal reading gradient pulse;
   (f) repeating steps (b) through (e) while varying the length of time said first signal reading gradient pulse is applied and varying an intensity of said phase encoding gradient pulse to construct a slice image on the basis of a plurality of said magnetic resonance signals from said repeated steps (b) through (e).

6. A method of magnetic resonance imaging according to claim 5, wherein a time period from the application of said first RF magnetic field pulse until the application of said second RF magnetic field pulse is fixed.

7. A method of magnetic resonance imaging according to claim 5, wherein said magnetic resonance signal is output upon expiration of a predetermined time period after the application of said second signal reading gradient pulse, said predetermined time period being equal to said time period of application of said first signal reading gradient pulse.

8. A method of magnetic resonance imaging according to claim 5, wherein said time period of application of said first signal reading gradient pulse is made longer for each repeated sequence of steps (b) through (e) so that the generation of said plurality of said magnetic resonance signals is retarded.

9. A method of magnetic resonance imaging according to claim 5, wherein said time period of application of said first signal reading gradient pulse is made shorter for each repeated sequence of steps (b) through (e) so that the generation of said plurality of said magnetic resonance signals is advanced.

* * * * *